United States Patent
Kloster et al.

(10) Patent No.: US 6,867,125 B2
(45) Date of Patent: Mar. 15, 2005

(54) CREATING AIR GAP IN MULTI-LEVEL METAL INTERCONNECTS USING ELECTRON BEAM TO REMOVE SACRIFICIAL MATERIAL

(75) Inventors: Grant Kloster, Lake Oswego, OR (US); Jihperng Leu, Portland, OR (US); Hyun-Mog Park, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/259,047

(22) Filed: Sep. 26, 2002

(65) Prior Publication Data

US 2004/0063305 A1 Apr. 1, 2004

(51) Int. Cl.[7] .......................................... H01L 21/4763
(52) U.S. Cl. ........................ 438/618; 438/619; 438/623; 438/624; 438/633; 438/634; 438/637; 438/638
(58) Field of Search .................. 438/618, 619, 438/622, 623, 624, 631, 633, 634, 637, 638

(56) References Cited

U.S. PATENT DOCUMENTS

| | | | | |
|---|---|---|---|---|
| 5,923,074 A | * | 7/1999 | Jeng ............................ | 257/522 |
| 6,071,805 A | * | 6/2000 | Liu ............................. | 438/619 |
| 6,165,890 A | * | 12/2000 | Kohl et al. ................. | 438/619 |
| 6,413,852 B1 | * | 7/2002 | Grill et al. .................. | 438/619 |
| 6,555,467 B2 | * | 4/2003 | Hsu et al. .................... | 438/633 |
| 2002/0158337 A1 | * | 10/2002 | Babich et al. .............. | 257/758 |
| 2003/0203592 A1 | * | 10/2003 | Kloster et al. ............. | 438/411 |
| 2004/0137728 A1 | * | 7/2004 | Gallagher et al. .......... | 438/689 |

* cited by examiner

*Primary Examiner*—Mary Wilczewski
*Assistant Examiner*—Toniae M. Thomas
(74) *Attorney, Agent, or Firm*—Blakely, Sokoloff, Taylor & Zafman LLP

(57) ABSTRACT

An embodiment of the present invention includes a method to form an air gap in a multi-layer structure. A dual damascene structure is formed on a substrate. The dual damascene structure has a metallization layer, a barrier layer, a sacrificial layer, and a hard mask layer. The sacrificial layer is made of a first sacrificial material having substantial thermal stability and decomposable by an electron beam. The sacrificial layer is removed by the electron beam to create the air gap between the barrier layer and the hard mask layer.

16 Claims, 7 Drawing Sheets

CREATING AIR GAP IN MULTI-LEVEL METAL INTERCONNECTS USING ELECTRON BEAM TO REMOVE SACRIFICIAL MATERIAL

BACKGROUND

1. Field of the Invention

Embodiments of the invention relate to the field of semiconductor, and more specifically, to semiconductor fabrication.

2. Description of the Related Art

Low dielectric constant (low-k) materials are used in interlayer dielectrics (ILD) in semiconductor devices to reduce propagation delay and improve device performance. As device sizes continue to shrink, the dielectric constant of the material between the metal lines should decrease to maintain the improvement. The eventual limit for the dielectric constant is k=1, which is the value for vacuum. This can be achieved by producing a void space between the metal lines, effectively creating an air gap. Air itself has a dielectric constant very close to 1. One major problem with air gap technology is the removal of sacrificial material to fabricate multi-layer structures.

Existing techniques to remove sacrificial material have a number of drawbacks. Use of plasmas may be destructive to the metal lines. Wet etches have many problems, including capillary forces that can break the lines apart, the difficulty in removing material from small features, and the difficulty in removing the wet etch chemical once it has been introduced. Thermal decomposition presents problems in that the sacrificial material must remain stable during high temperature fabrications stages, but it may decompose rapidly at normal temperatures that will not destroy the device.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a method to form an air gap in a multi-layer structure. A dual damascene structure is formed on a substrate. The dual damascene structure has a metallization layer, a barrier layer, a sacrificial layer, and a hard mask layer. The sacrificial layer is made of a sacrificial material having substantial thermal stability and decomposable by an electron beam. The sacrificial layer is removed by the electron beam to create the air gap between the barrier layer and the hard mask layer.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

Figure 1:
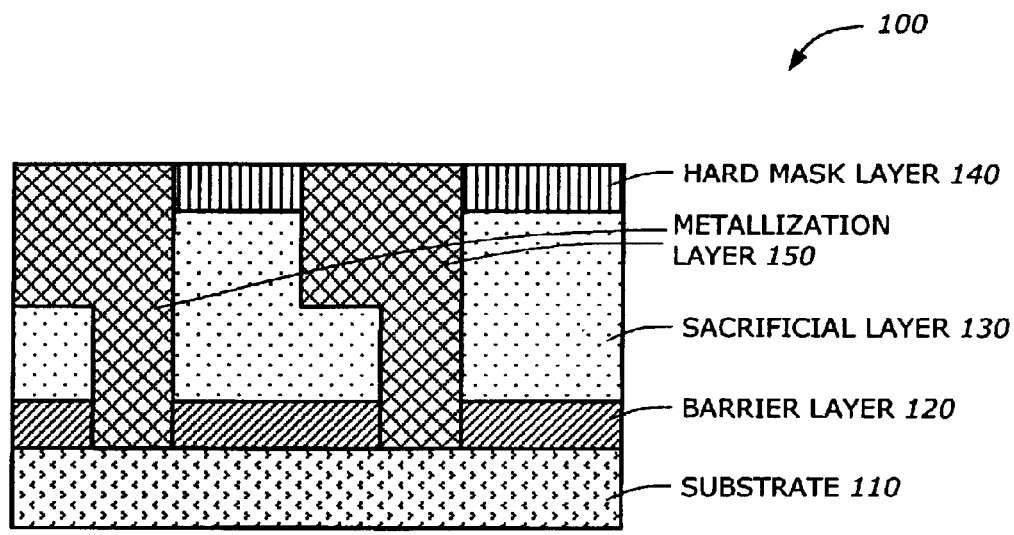
FIG. 1 is a diagram illustrating a dual damascene structure in which one embodiment of the invention can be practiced.

FIG. 1 is a diagram illustrating a dual damascene structure 100 in which one embodiment of the invention can be practiced. The dual damascene structure 100 includes a substrate 110, a barrier layer 120, a sacrificial layer 130, a hard mask layer 140, and metallization layer 150.

The dual damascene is a multi-level interconnection process in which, in addition to the opening or channels of single damascene, the conductive via openings are also formed. The substrate 110 is any suitable substrate for the device fabrication such as silicon. The barrier layer 120 is deposited on the substrate 110. The barrier layer 120 may be an etch stop or a diffusion layer such as silicon oxide ($SiO_2$) or silicon nitride ($Si_3N_4$). The sacrificial layer 130 is formed by depositing a sacrificial material on the barrier layer 120. The sacrificial material has substantial thermal stability and decomposable by electron beam (e-beam). Thermal stability here refers to the ability to sustain the temperature range in the fabrication process. The sacrificial material may be one of a low-k dielectric and an e-beam photo resist material. E-beam photo-resists are not stable enough to withstand thermal conditions during normal device fabrication, but materials based on their composition could be designed for optimal decomposition by e-beam. The positive tone e-beam positive such as ZEP-520™ (by Nippon Zeon), ALEX-E™, or (poly(methyl methacrylate)) (PMMA) are based on styrene, or butene, acrylate. These components can be incorporated in a cross-linked aromatic polymer to produce a thermally stable material that is susceptible to chain scission by e-beam. The hard mask layer 140 is deposited on the sacrificial layer 130 by any conventional methods such as plasma enhanced vapor deposition, chemical vapor deposition, and physical vapor deposition. The hard mask layer 140 may be porous or non-porous and may be made by materials such as silicon oxide, silicon nitride, carbon-doped silicon nitride ($SICN_x$), silicon oxy-nitride, sputtered silicon, amorphous silicon, or amorphous carbon. Alternatively, the hard mask layer 140 may be a porous interlevel dielectric (ILD). The hard mask layer 140,.the sacrificial layer 130, and the barrier layer 120 are then patterned and etched to form an opening, groove, or channel. The metallization layer 150 is then formed by filling the opening with metal such as copper or copper-aluminum alloys. A chemical mechanical polishing (CMP) process removes the excess metal and polishes the metallization layer 150.

Figure 2:
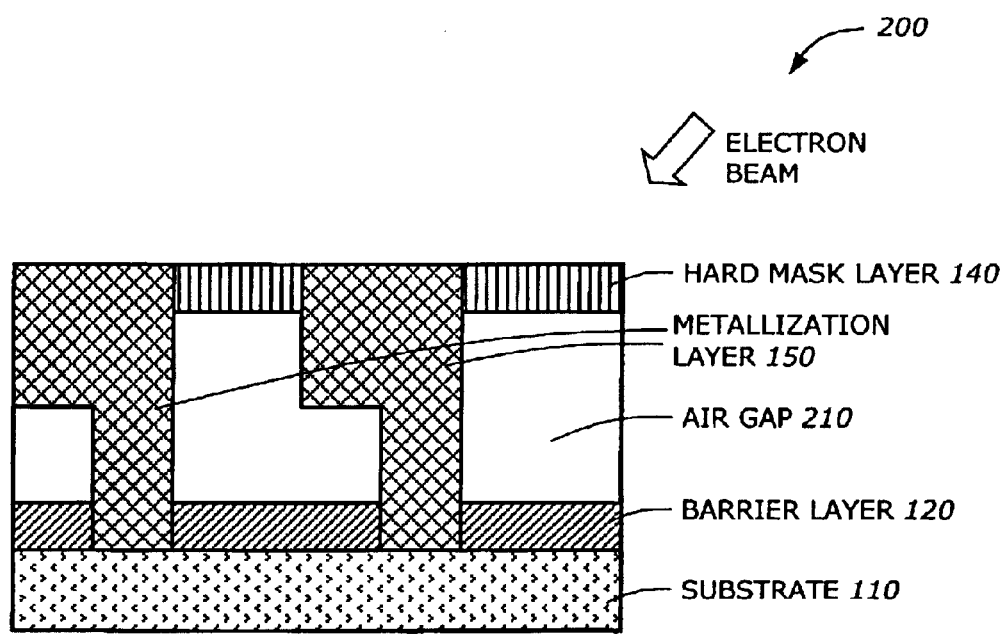
FIG. 2 is a diagram illustrating formation of an air gap according to one embodiment of the invention.

FIG. 2 is a diagram illustrating formation 200 of an air gap according to one embodiment of the invention. The dual damascene structure 100 is then subjected to e-beam processing to create the air gap.

A number of e-beam sources exist and are used in tools for device fabrication. E-beam is known to interact with materials destructively. For example, silsesquioxane materials undergo carbon depletion and film shrinkage upon e-beam treatment. Polymers can be completely decomposed by e-beam exposure at relatively low energies, as observed in scanning electron microscopy (SEM) samples not coated with metal surface layers, and in e-beam lithography with positive c-beam photo-resists.

Since the sacrificial layer 130 is made of a sacrificial material that has thermal stability and is decomposable by e-beam, the e-beam decomposes the sacrificial material into volatile components such as carbon dioxide, hydrocarbons, aldehydes, etc. These volatile components are then removed by mild thermal processing. In one embodiment, the temperature range for the thermal processing may be between 100° C. to 200° C. The volatile components can diffuse out of the device through the hard mask layer 140. The sacrificial layer 130 then becomes an air gap that provides a dielectric constant of close to 1.

Figure 3:
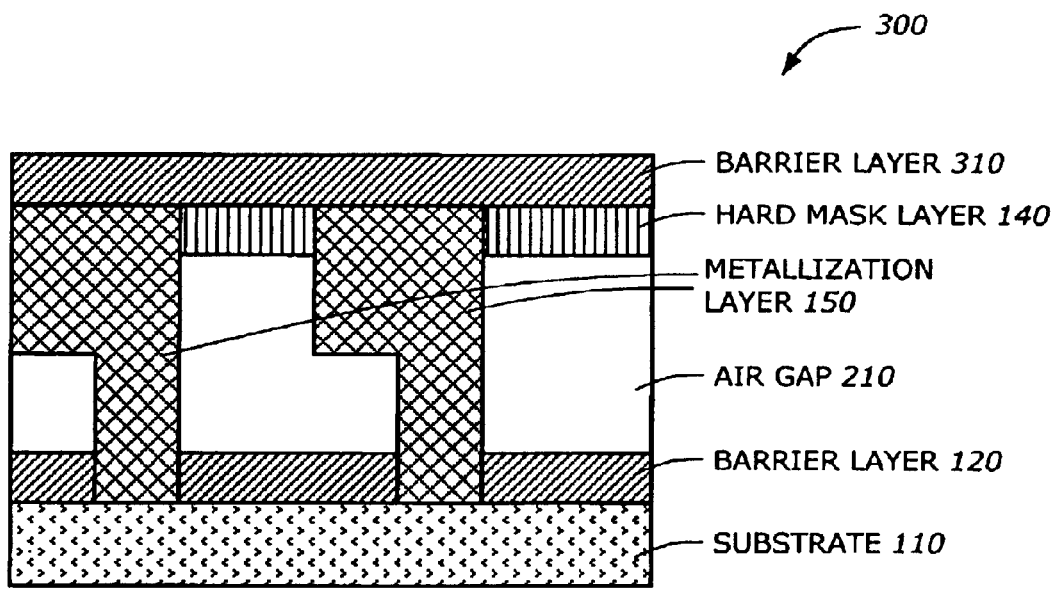
FIG. 3 is a diagram illustrating deposit of barrier layer according to one embodiment of the invention.

FIG. 3 is a diagram illustrating deposit 300 of barrier layer according to one embodiment of the invention. To prepare for an additional layer, a barrier layer 310 is deposited on the dual damascene structure 200. The barrier layer 310 may be an etch stop or a diffusion layer such as $SiO_2$ or $Si_3N_4$. Alternatively, a Co shunt may be deposited as a barrier, then a porous etch-stop layer is deposited. Then, the sacrificial material is removed by e-beam. The Co shunt would act as a diffusion barrier.

Figure 4:
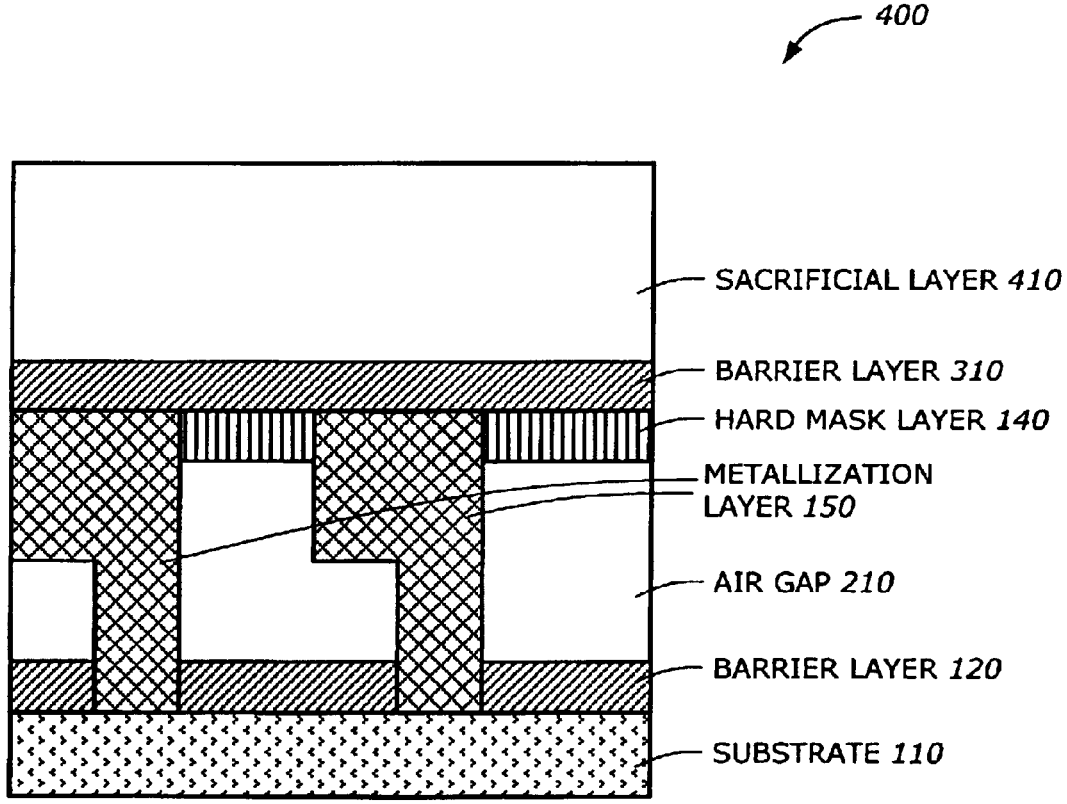
FIG. 4 is a diagram illustrating deposit of sacrificial layer according to one embodiment of the invention.

FIG. 4 is a diagram illustrating deposit 400 of sacrificial layer according to one embodiment of the invention. A sacrificial layer 410 is deposited on the barrier layer 310. The sacrificial layer 410 is made of material similar to that of the sacrificial layer 130 shown in FIG. 1. In essence, the sacrificial layer 410 is made of material having substantial thermal stability and decomposable by e-beam. Separate sacrificial materials may be deposited for the via and trench levels.

Figure 5:
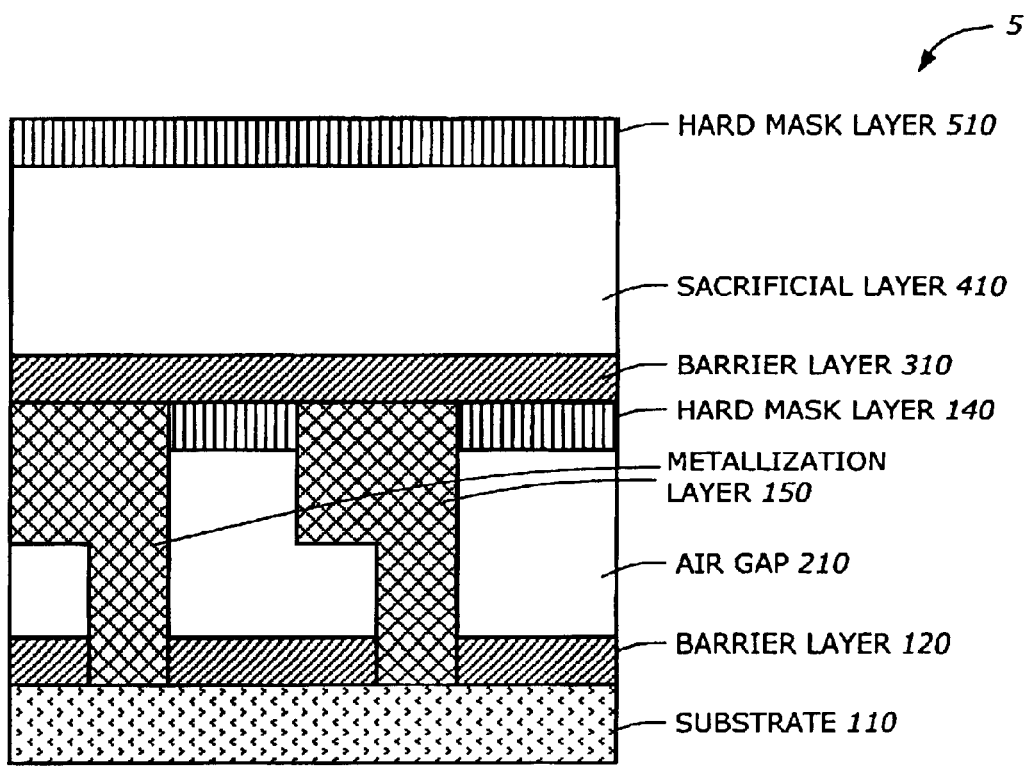
FIG. 5 is a diagram illustrating deposit of hard mask layer according to one embodiment of the invention.

FIG. 5 is a diagram illustrating deposit 500 of hard mask layer according to one embodiment of the invention. A hard mask layer 510 is deposited on the sacrificial layer 410 by any conventional methods such as plasma enhanced vapor deposition, chemical vapor deposition, and physical vapor deposition. The hard mask layer 510 in essence is similar to the hard mask layer 140 shown in FIG. 1. In other words, it may be porous or non-porous and may be made by materials such as silicon oxide, silicon nitride, carbon-doped silicon nitride ($SICN_x$), silicon oxy-nitride, sputtered silicon, amorphous silicon, or amorphous carbon. Alternatively, the hard mask layer 510 may be a porous interlevel dielectric (ILD).

Figure 6:
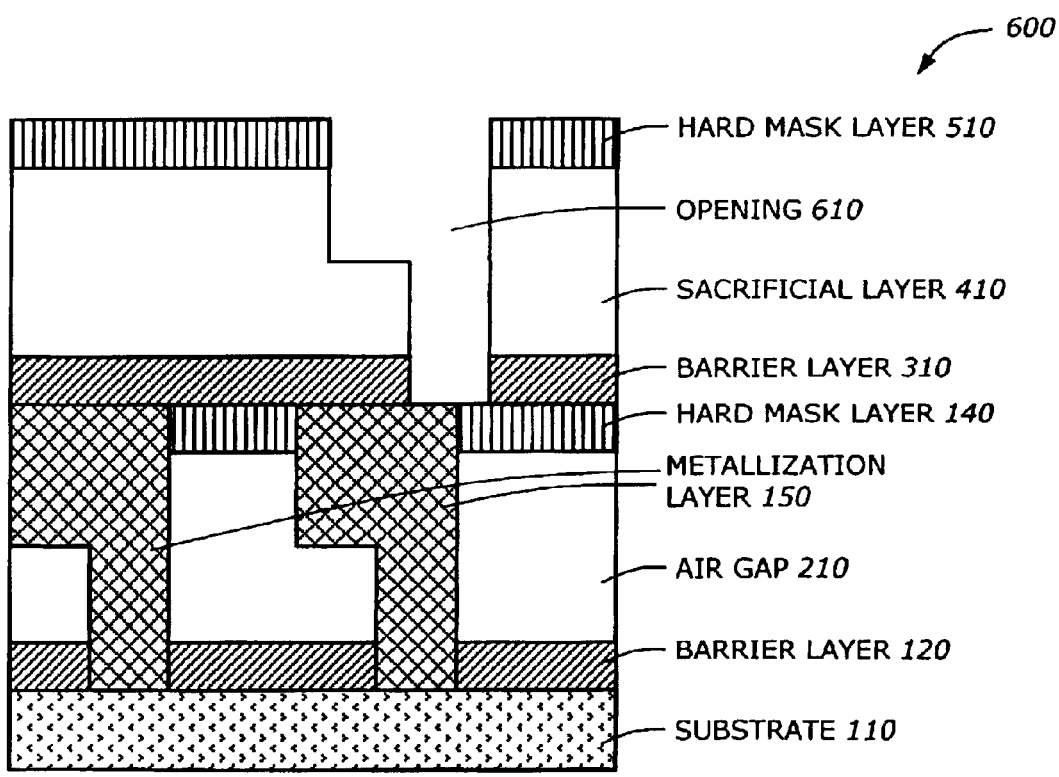
FIG. 6 is a diagram illustrating formation of opening according to one embodiment of the invention.

FIG. 6 is a diagram illustrating formation 600 of opening according to one embodiment of the invention. The hard mask layer 510 is patterned for the metal interconnects. The hard mask layer 510, the sacrificial layer 410, and the barrier layer 310 are then etched, ashed, and cleaned to form a groove, void, or opening 610.

Figure 7:
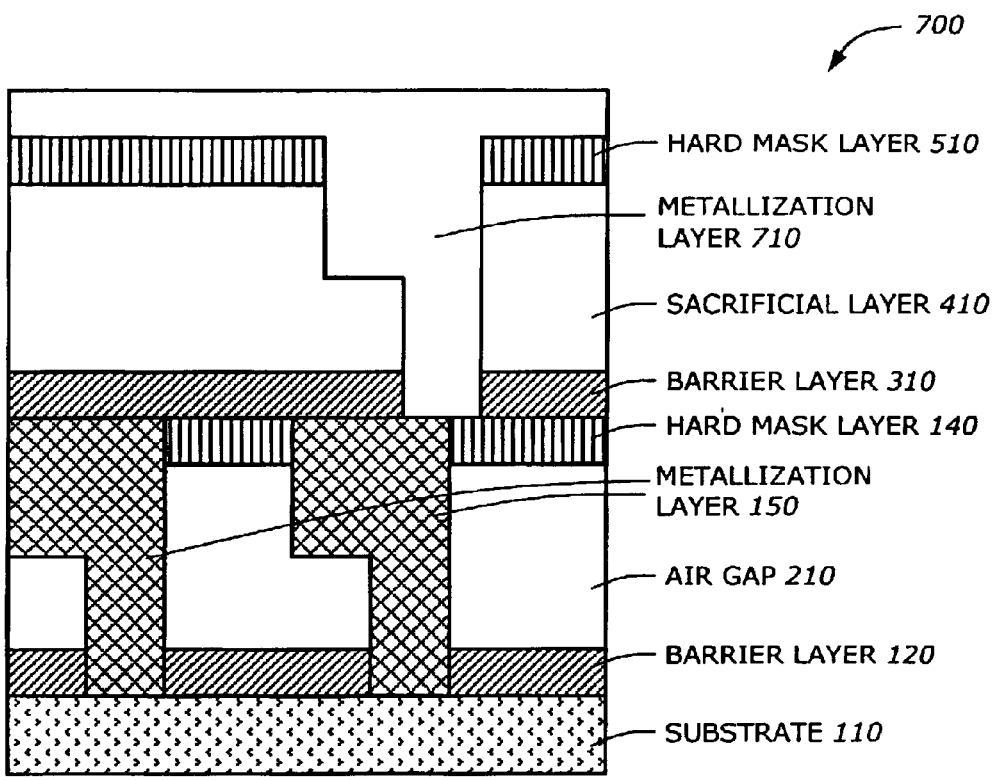
FIG. 7 is a diagram illustrating deposit of metal according to one embodiment of the invention.

FIG. 7 is a diagram illustrating deposit 700 of metal according to one embodiment of the invention. Barrier, seed, and metal are deposited to fill the opening 610. Any suitable metal material can be used. In one embodiment, copper is used as the metal material. A metallization layer 710 is formed.

Figure 8:
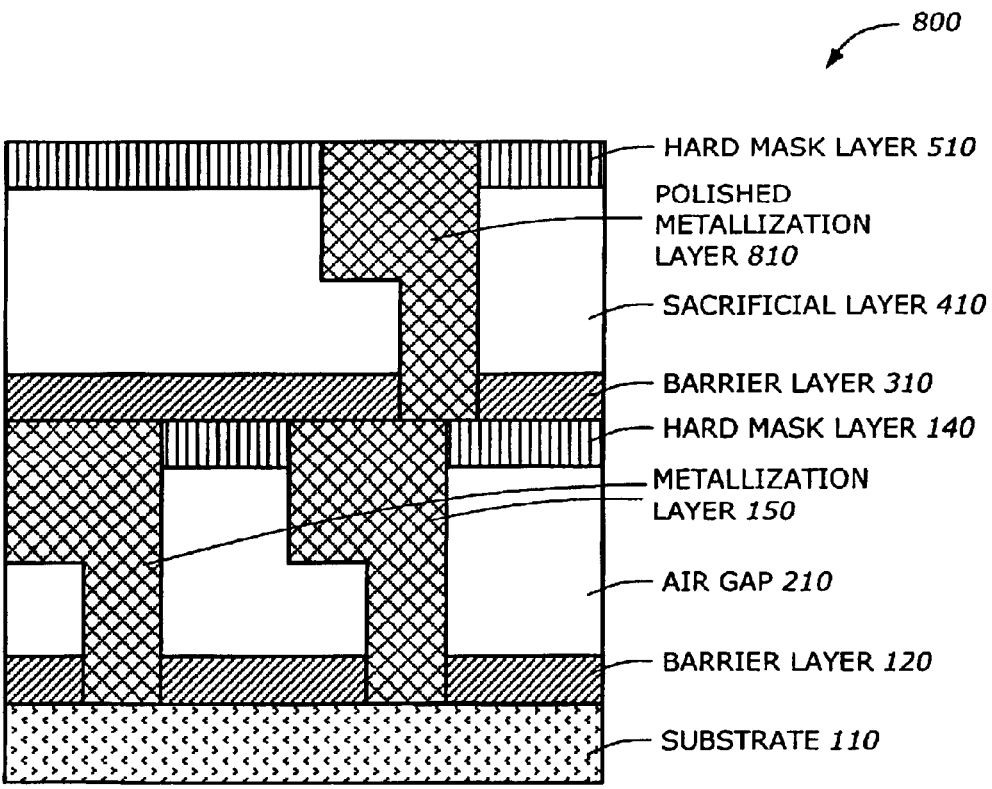
FIG. 8 is a diagram illustrating removal of excess metal according to one embodiment of the invention.

FIG. 8 is a diagram illustrating removal 800 of excess metal according to one embodiment of the invention. A chemical mechanical planarization or polishing (CMP) process is then performed to remove excess metal and to polish the metallization layer 710 to form a polished metallization layer 810. To avoid crushing the metal lines, a low-down force CMP process is typically used.

Figure 9:
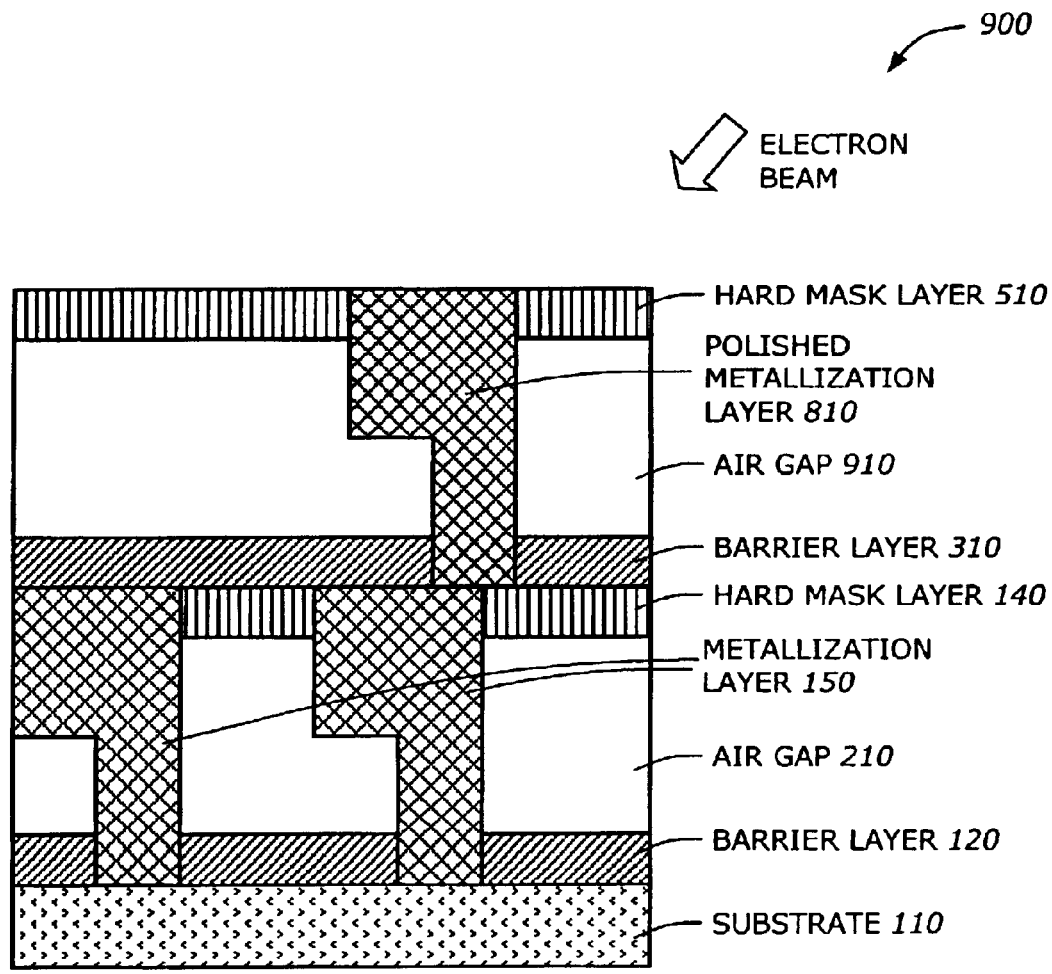
FIG. 9 is a diagram illustrating formation of air gap according to one embodiment of the invention.

FIG. 9 is a diagram illustrating formation 900 of air gap according to one embodiment of the invention. The e-beam is then used to penetrate through the hard mask layer 510 to decompose the sacrificial material of the sacrificial layer 410 into volatile components which diffuse out of the hard mask layer 510 by mild thermal processing as discussed earlier. An air gap 910 is then formed between the hard mask layer 510 and the barrier layer 310 and between the metal lines of the metallization layers in the multi-layer device. The air gap 910 provides a dielectric layer having a dielectric constant of close to 1.

The process as shown from FIGS. 2 through 9 can be repeated for additional layers built upon the dual damascene structure 100 shown in FIG. 1.

Figure 10:
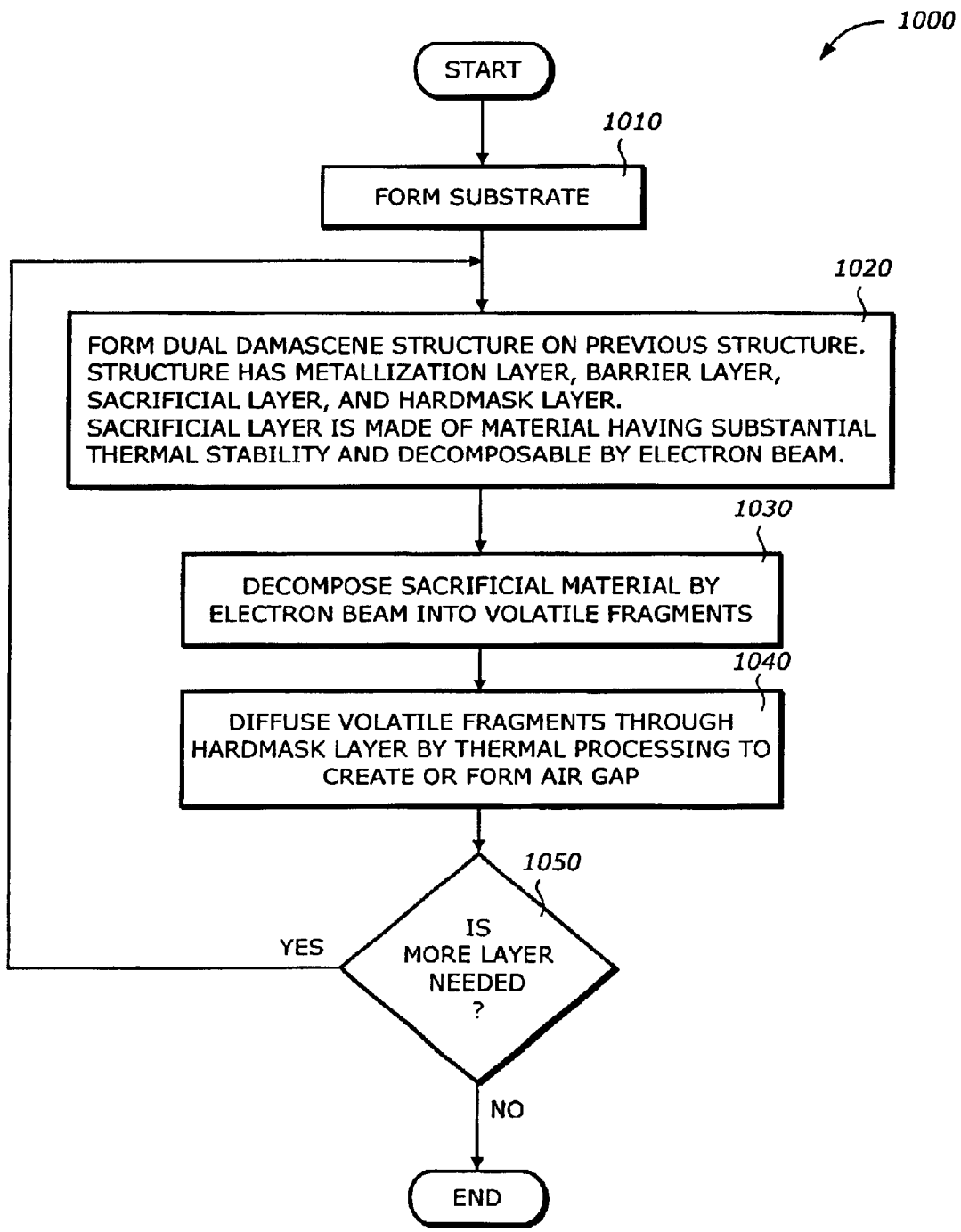
FIG. 10 is a flowchart illustrating a process to create an air gap according to one embodiment of the invention.

FIG. 10 is a flowchart illustrating a process 1000 to create an air gap according to one embodiment of the invention.

Upon START, the process 1000 forms a substrate (Block 1010). Then, the process 1000 forms a dual damascene structure on the previous structure (Block 1020). For the first iteration, the previous structure is the substrate. For subsequent iterations corresponding to subsequent layers, the previous structure is the dual damascene structure formed in the previous iteration. The dual damascene structure has a metallization layer, a barrier layer, a sacrificial layer, and a hard mask layer. The sacrificial layer is made of a sacrificial material that has substantial thermal stability and decomposable by electron beam. The Block 1020 is described in more detail in FIG. 11.

Next, the process 1000 decomposes the sacrificial material of the sacrificial layer by electron beam into volatile components or fragments (Block 1030). Then, the process 1000 diffuses the volatile components through the hard mask layer by thermal processing (Block 1040). The sacrificial layer then becomes an air gap. Next, the process 1000 determines if more layer is needed in the fabrication (Block 1050). If so, the process 1000 returns to Block 1020 to continue building an additional structure. Otherwise, the process 1000 is terminated.

Figure 11:
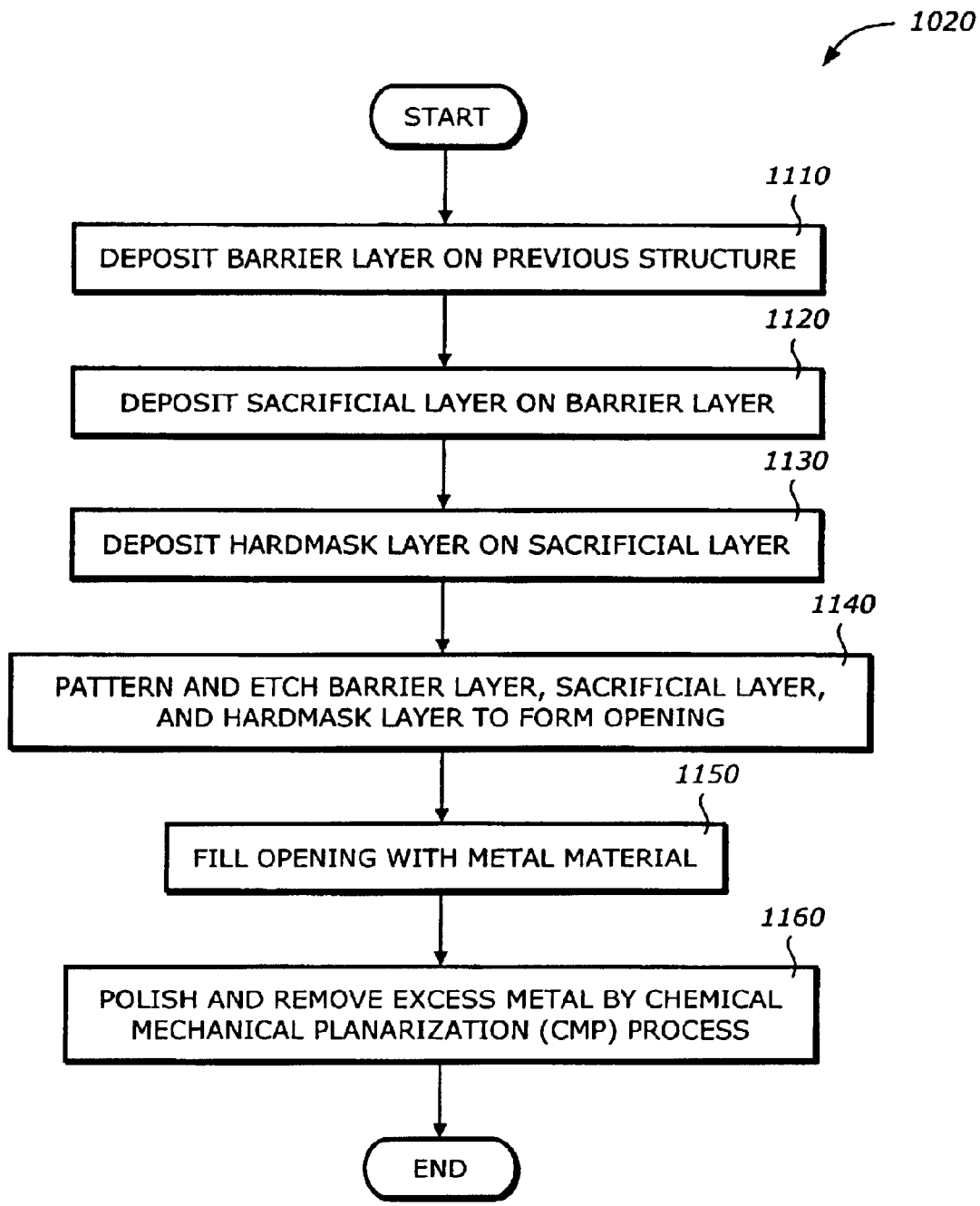
FIG. 11 is a flowchart illustrating a process to form a dual damascene structure according to one embodiment of the invention.

FIG. 11 is a flowchart illustrating the process 1020 to form a dual damascene structure according to one embodiment of the invention.

Upon START, the process 1020 deposits the barrier layer on the previous structure (Block 1110). As described earlier, the previous structure may be the substrate or the previous layer. Then, the process 1020 deposits the sacrificial layer on the barrier layer (Block 1120). Next, the process 1020 deposits the hard mask layer on the sacrificial layer (Block 1130).

Then, the process 1020 patterns and etches the barrier layer, the sacrificial layer, and the hard mask layer to form an opening for the metal deposition (Block 1140). Next, the process 1020 fills the opening with the metal material (Block 1150). Then, the process 1020 polishes and removes excess metal material by a CMP processing (Block 1160). The process 1020 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:

forming a first dual damascene structure on a substrate, the first dual damascene structure having a first metallization layer, a first barrier layer, and a first sacrificial layer, and a first hard mask layer, the first sacrificial layer being made of a first sacrificial material having substantial thermal stability and decomposable into volatile fragments by an electron beam; and removing the first sacrificial layer by the electron beam to create a first air gap between the first barrier layer and the first hard mask layer, removing comprising decomposing the first sacrificial material by the electron beam into first volatile fragments, and diffusing the first volatile fragments through the first hard mask layer by thermal processing.

2. The method of claim 1 wherein forming the first dual damascene structure comprises:

depositing the first barrier layer on the substrate;

depositing the first sacrificial layer on the first barrier layer;

depositing the first hard mask layer on the first sacrificial layer;

patterning and etching the first barrier layer, the first sacrificial layer, and the first hard mask layer to form a first opening;

filling the first opening with a metal material; and polishing and removing excess metal by a chemical mechanical planarization (CMP) process.

3. The method of claim 2 wherein depositing the first barrier comprises:

depositing one of an etch stop and a diffusion barrier layer.

4. The method of claim 2 wherein depositing the first sacrificial layer comprises:

depositing one of a low-k dielectric and an electron beam photo resist material.

5. The method of claim 4 wherein the electron beam photo resist material is produced from a cross-linked aromatic polymer incorporated with a positive tone electron beam photo resist, the electron beam photo resist being based on one of acrylate, styrene, and butene.

6. The method of claim 1 wherein diffusing comprises:

diffusing the first volatile fragments through the first hard mask layer by thermal processing at a temperature range between 100° C. to 200° C.

7. The method of claim 1 further comprising:

forming a second dual damascene structure on the first dual damascene structure, the second dual damascene structure having a second metallization layer, a second barrier layer, a second sacrificial layer, and a second hard mask layer, the second sacrificial layer being made of a second sacrificial material having substantial thermal stability and decomposable by the electron beam; and removing the second sacrificial layer by the electron beam to create a second air gap between the second barrier layer and the second hard mask layer.

8. The method of claim 7 wherein forming the second dual damascene structure comprises:

depositing the second barrier layer on the first dual damascene structure;

depositing the second sacrificial layer on the second barrier layer;

depositing the second hard mask layer on the second sacrificial layer;

patterning and etching the second barrier layer, the second sacrificial layer, and the second hard mask layer to form a second opening;

filling the second opening with the metal material; and polishing and removing excess metal by the (CMP) process.

9. The method of claim 7 wherein removing the second sacrificial layer comprises:

decomposing the second sacrificial material by the electron beam into second volatile fragments; and diffusing the second volatile fragments through the second hard mask layer.

10. The method of claim 9 wherein diffusing the second volatile fragments comprises:

diffusing the second volatile fragments through the second hard mask layer by thermal processing.

11. The method of claim 10 wherein diffusing the second volatile fragments comprises:

diffusing the second volatile fragments through the second hard mask layer by thermal processing at a temperature range between 100° C. to 200° C.

12. A method comprising:

depositing a barrier layer on a structure;

depositing a sacrificial layer on the barrier layer, the sacrificial layer being made of a sacrificial material having substantial thermal stability and decomposable into volatile fragments by an electron beam;

depositing a hard mask layer on the sacrificial layer;

patterning and etching the barrier layer, the sacrificial layer, and the hard mask layer to form an opening;

filling the opening with a metal material;

polishing and removing excess metal by a chemical mechanical planarization (CMP) process; and removing the sacrificial layer by the electron beam to create an air gap between the barrier layer and the hard mask layer: comprising decomposing the sacrificial material by the electron beam into volatile fragments, and diffusing the volatile fragments through the hard mask layer by thermal processing.

13. The method of claim 12 wherein depositing the barrier comprises: depositing one of an etch stop and a diffusion barrier layer on the structure, the structure being one of a substrate and a dual damascene structure.

14. The method of claim 13 herein depositing the sacrificial layer comprises: depositing one of a low-k dielectric and an electron beam photo resist material.

15. The method of claim 14 wherein the electron beam photo resist material is produced from a cross-linked aromatic polymer incorporated with a positive tone electron beam photo resist, the electron beam photo resist being based on one of acrylate, styrene, and butene.

16. The method of claim 12 wherein diffusing comprises:

diffusing the volatile fragments through the hard mask layer by thermal processing at a temperature range between 100° C. to 200° C.

* * * * *

UNITED STATES PATENT AND TRADEMARK OFFICE
CERTIFICATE OF CORRECTION

PATENT NO. : 6,867,125 B2
DATED : March 15, 2005
INVENTOR(S) : Kloster et al.

It is certified that error appears in the above-identified patent and that said Letters Patent is hereby corrected as shown below:

Column 6,
Line 54, delete "herein" and insert -- wherein --.

Signed and Sealed this

Seventeenth Day of May, 2005

JON W. DUDAS
*Director of the United States Patent and Trademark Office*